United States Patent [19]
Kudou et al.

[11] Patent Number: 5,401,988
[45] Date of Patent: Mar. 28, 1995

[54] STANDARD CELL LAYOUT ARRANGEMENT FOR AN LSI CIRCUIT

[75] Inventors: Tsuneaki Kudou, Kawasaki; Hiroyuki Watanabe, Tokyo, both of Japan

[73] Assignee: Kabushiki Kaisha Toshiba, Kawasaki, Japan

[21] Appl. No.: 974,322

[22] Filed: Nov. 10, 1992

Related U.S. Application Data

[63] Continuation of Ser. No. 639,780, Jan. 14, 1991, abandoned, which is a continuation of Ser. No. 372,476, Jun. 28, 1989, abandoned.

Foreign Application Priority Data

Jun. 28, 1988 [JP] Japan .................. 63-158005

[51] Int. Cl.⁶ .................. H01L 27/02; H01L 27/10; H01L 27/15
[52] U.S. Cl. .................. 257/207; 257/202
[58] Field of Search .................. 357/40, 45; 307/296.1, 307/175, 407, 303; 173/524; 275/202–207

[56] References Cited

U.S. PATENT DOCUMENTS

| | | | |
|---|---|---|---|
| 4,198,695 | 4/1980 | McElroy | 365/154 |
| 4,256,984 | 3/1981 | Kojima | 307/296 R |
| 4,295,149 | 10/1981 | Balyoz et al. | 357/45 |
| 4,412,237 | 10/1983 | Matsumura et al. | 357/42 |
| 4,423,432 | 12/1983 | Stewart et al. | 357/45 |
| 4,516,040 | 5/1985 | Zapisek et al. | 307/468 |
| 4,851,893 | 7/1989 | Giannella | 257/204 |
| 4,949,149 | 7/1990 | Arraut et al. | 357/45 |
| 4,949,275 | 8/1990 | Nonaka | 364/490 |
| 4,989,062 | 1/1991 | Takahashi | 357/45 |

FOREIGN PATENT DOCUMENTS

| | | | |
|---|---|---|---|
| 0006958 | 1/1980 | European Pat. Off. | |
| 58-166742 | 10/1983 | Japan | 257/207 |
| 60-198843 | 10/1985 | Japan | 257/205 |
| 0185964 | 8/1986 | Japan | 357/45 |
| 0037034 | 2/1989 | Japan | 357/40 |

OTHER PUBLICATIONS

Kessler et al., Standard Cell VLSI Design, A Tutorial, IEEE Circuts and Devices Magazine Jan. 1985 pp. 17–20.

A. V. Brown, IBM Tech. Disc. Bulletin vol. 8 No. 3 Aug. 1965 pp. 463–464.

T. E. Dillinger, *VLSI Engineering*, Prentice-Hall (1988) Chapter 3, pp. 55–90.

L. W. Massengill, "Volatage Span Modeling For Very Large Memory Arrays", 19–21 Jun. 1985, Trinity College, Dublin, Ireland, NASECODE IV, pp. 396–404.

"Computers and Digital Electronics", *Machine Design*, May, 1988, pp. 12–29.

*Primary Examiner*—J. Carroll
*Attorney, Agent, or Firm*—Foley & Lardner

[57] ABSTRACT

A large scale standard cell is provided with at least three wire power source wires and at least two circuit-element-arranging areas interposed therebetween, whereby the lateral length of the cell can be flexibly reduced to owing delay due to wire resistance and capacity and to reduce the area of the cell or the entire area of a circuit pattern composed therewith. The vertical direction of the cell is optionally changeable in one cell row.

14 Claims, 5 Drawing Sheets

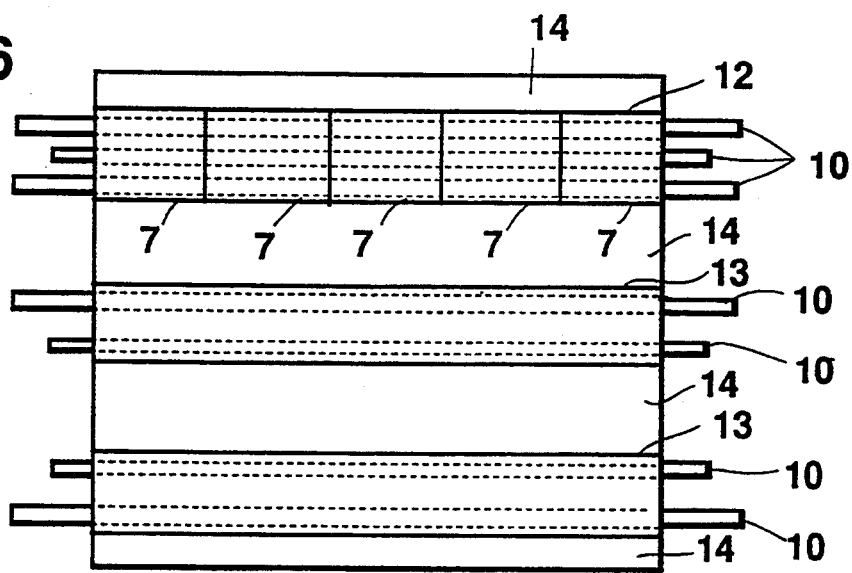
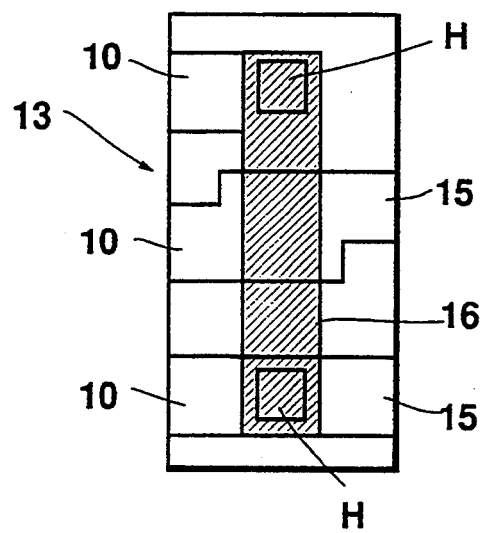
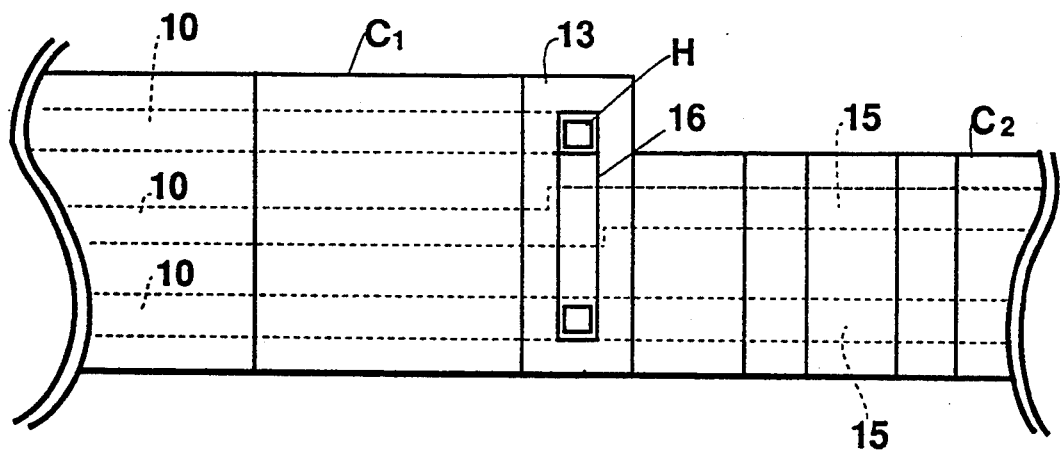

STANDARD CELL LAYOUT ARRANGEMENT FOR AN LSI CIRCUIT

This application is a continuation of application Ser. No. 07/639,780, filed Jan. 14, 1991, now abandoned, which is a continuation of application Ser. No. 07/372,476, filed Jun. 28, 1989, now abandoned.

BACKGROUND OF THE INVENTION

1. Field of the Invention

The present invention relates to a standard cell layout for a LSI (large scale integrated circuit), and particularly to a large scale standard cell like a flip-flop standard cell (a so called bistable standard cell) whose length in the direction of the power source wire thereof can be controlled so as not to be larger than required.

2. Description of the Prior Art

A conventional standard cell used for a layout of a large scale integrated circuit, particularly a large scale cell like a flip-flop standard cell has a relatively long length in the direction of the power source wire thereof (hereinafter this direction is called the lateral direction) as compared with cells other than the flip-flop cell. Thus, when a circuit pattern is composed by combination of the flip-flop cell and others, a dead space tends to be produced in the circuit pattern owing to the uniformity of their lateral lengths. Accordingly, there is an inconvenience in the design of the circuit patterns composed by the combination.

FIG. 1 shows a composition of a conventional standard cell. As shown in the drawing, there are provided in the cell two power source wires 1, 1 extending substantially parallel to the lateral direction (X axis) of the cell so that a group of circuit elements such as transistors and diodes for composing a logical circuit are arranged in a space 2 defined between the two power source wires 1, 1.

Particularly, when flip-flop standard cells composed by the circuit elements as mentioned above are arranged in one cell row, the lateral length of the row becomes considerably large.

FIG. 2 shows a cell from which clock skew tends to occur, and FIG. 3 shows waveforms produced by clock skew shifting in timing from an original clock.

In FIG. 2, a driven clock is input to a circuit 20 comprising a plurality of cells respectively having a relatively long length and supplied by a clock signal i through a buffer 21. A clock signal (a) inputted to a cell A and a clock signal (b) inputted to a cell B are different from each other in their time constants determined by a wire resistance and a wire capacity between the buffer 21 and the cell A, and a wire resistance and capacity between the buffer 21 and the cell B.

Thus, as shown in FIG. 3, rise times of the original clock signal i, clock signal (a) inputted through $Ri_1$ and $Ci_1$, and clock signal (b) inputted via $Ri_2$, $Ci_2$, $Ri_3$, and $Ci_3$, shift from one another due to respective delays caused by the differences in the time constants. The shift is generally called clock skew. Accordingly, there has been desired a suitable layout of the cells to avoid then clock skew.

The clock line causing clock skew becomes long and large when flop-flop cells are scattered. Accordingly, if all the flip-flop cells are arranged in one cell row, it makes clock skew small. However, if the flip-flop cells are conventional ones, the following problems occur.

FIG. 4 shows an abstract layout of a portion of an IC composed of conventional cells, in which are shown a cell row including only flip-flop cells 3 and other cell rows including cells 4 other than flip-flop cells. As seen from the drawing, there are dead spaces 5 produced by the differences of the lateral lengths of the rows of the flip-flop cells. Accordingly, an area of the circuit pattern composed of the conventional cells by automatic placement and routing becomes larger than required.

Moreover, the conventional standard cell has only two power source wires 1, 1, thus it is impossible to connect cells inversely between the wires of the high potential side ($V_{DD}$) and the low potential side ($v_{SS}$) in one cell row.

SUMMARY OF THE INVENTION

It is therefore an object of the present invention to provide a novel standard cell in a large scale cell such as a flip-flop (bistable) standard cell whose lateral length can be controlled so as not to be larger than required, whereby an area of the cell and an entire area of a circuit pattern composed of the cells by automatic placement and routing can be reduced.

In order to achieve the above-mentioned object, a standard cell according to the present invention for automatic placement and routing is provided with at least three power source wires. Thus, the circuit elements such as transistors and diodes for composing a logical circuit can be arranged in at least two spaces respectively defined between each adjacent pair of the wires. Accordingly, when the lateral lengths of the standard cells according to the present invention and the prior art, required for arranging the same number of elements therein, are compared, the length of the former can be reduced to substantially half, or less, as compared with that of the latter because the elements can be arranged in at least two spaces in the case of the former.

As seen from the foregoing, according to the present invention, the delay caused by an increase of the wire resistance and capacity owing to the enlargement of the lateral direction of the cell can be controlled.

Moreover, since at least three power source wires are provided, the electrical potentials of respective wires can be arranged symmetrically in the vertical direction of the cell, thus making it possible to optionally change the vertical direction of the cell in one cell row.

The vertical length of the cell increases as the number of power source wires increases.

These and other objects, features and advantages of the present invention will be more apparent from the following description of preferred embodiments, taken in conjunction with the accompanying drawings.

BRIEF DESCRIPTION OF THE DRAWINGS

FIG. 6 is a view for explaining a composition of an embodiment of a standard cell composed by combination of cell rows respectively including flip-flop cells having three-wire type power source wires according to the present invention and other cells having two-wire type power source wires;

FIG. 7 is a view for explaining a composition of an embodiment of a connecting cell for connecting a cell having three-wire type power source wires according to the present invention and a cell having two-wire type power source wires;

FIG. 8 is a view for explaining a composition of an embodiment of connection according to the present invention using the connecting cell in FIG. 7;

DETAILED DESCRIPTION OF THE EMBODIMENT

Figure 5:
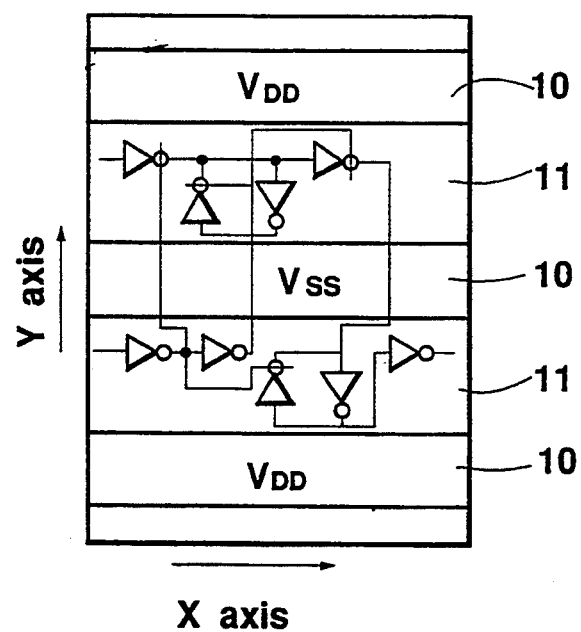
FIG. 5 is a view for explaining a basic composition of an embodiment of a standard cell according to the present invention.

FIG. 5 shows a basic composition of a standard cell according to the present invention.

Figure 1:
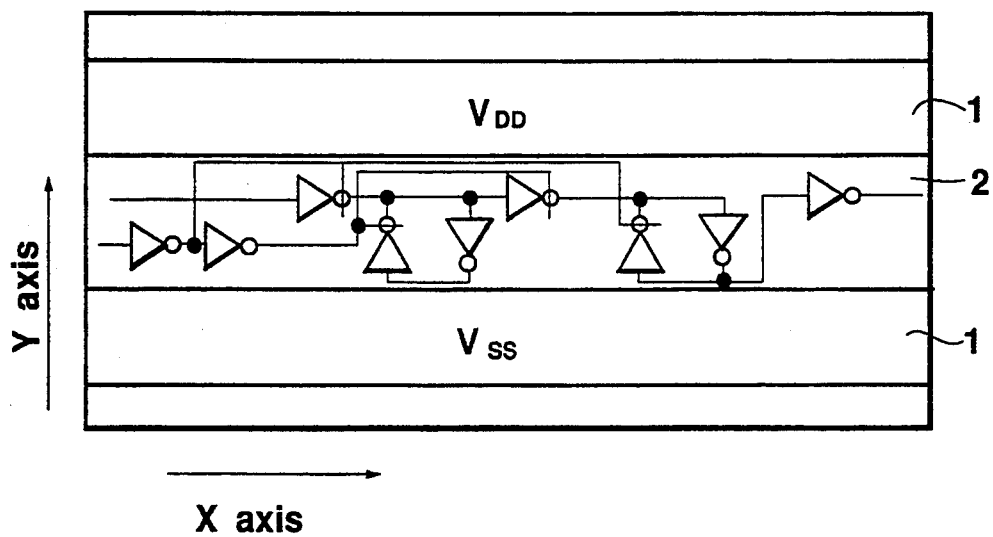
FIG. 1 is a view for explaining a composition of a cell having two-wire type power source wires according to prior art.
Figure 2:
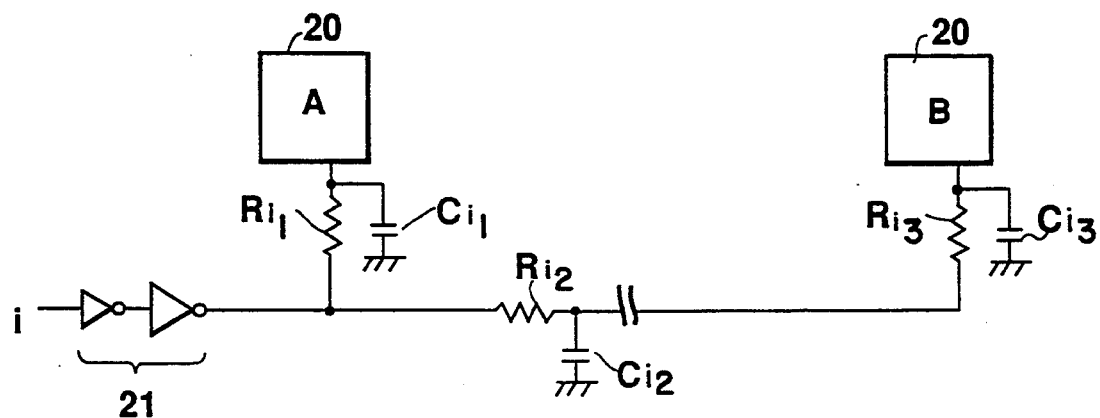
FIG. 2 shows a circuit from which clock skew is generated by delay factors.
Figure 3:
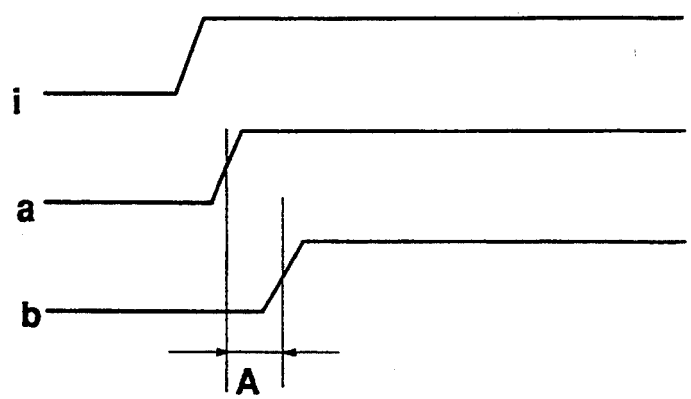
FIG. 3 shows clock waveforms for explaining clock skew generated in the circuit in FIG. 2.

As shown in the drawing, the standard cell for automatic placement and routing according to the present invention is provided with at least three power source wires 10. And, the central one of the power source wires 10 is a low potential power source wire and the outside two power source wires are high potential power source wires. Accordingly, there can be obtained at least two spaces 11, 11 defined between each adjacent pair of the wires for arrangement of circuit elements such as transistors and diodes for composing a logical circuit. Thus, if the lateral lengths of the standard cells according to the present invention and the prior art as shown in FIG. 1, required for arranging the same number of the elements therein, are compared, the length of the former can be substantially reduced to half or less to that of the latter because the elements can be arranged in at least two spaces in the case of the former.

The vertical length of the cell increases as the number of the power source wires increases. However, when the number of the power source wires becomes three, the vertical length of the cell is increased by only 1.5 times that of the prior art cell having two power source wires.

Since at least three power source-wires 10 are provided, the electrical potentials of respective wires can be arranged symmetrically in the vertical direction of the cell, thus it becomes possible to optionally change the vertical direction of the cell in one cell row.

FIG. 6 shows an abstract layout of a portion of an IC of an embodiment of the present invention. In the embodiment of the present invention, a plurality of flip-flop cells 7 are assembled together in one row 12, and other cells are assembled in the other rows 13, 13. Reference numerals 14 designate wiring areas respectively. As shown in the drawing, since three power source wires are provided in the flip-flop cells 7, if circuit elements for forming a logical circuit are suitably arranged therein, the lateral length of the cells 7 can be optionally reduced to a desired length.

Figure 4:
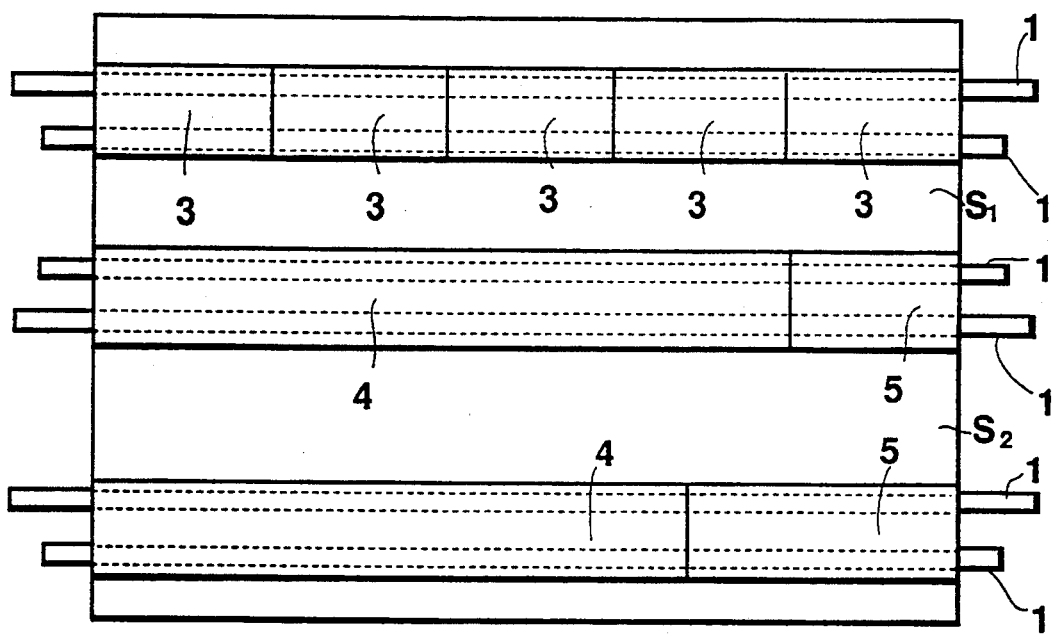
FIG. 4 shows an abstract layout of a portion of IC composed of a combination of cell rows respectively including flip-flop cells and other cells according to the prior art.

Accordingly, the length of the row 12 comprising the flip-flop cells of an embodiment according to the present invention shown in FIG. 6 can be adjusted to be substantially the same as that of the rows 13, 13, so that the dead space 5 produced in the composition of the standard cell comprising a combination of a conventional flip-flop cell and other cells as shown in FIG. 4 is eliminated.

Figure 9:
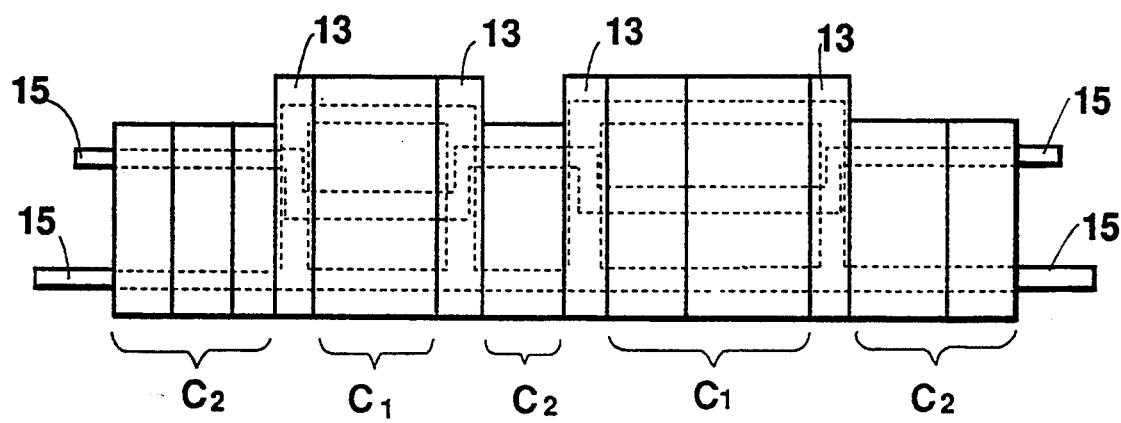
FIG. 9 shows an example of the connection of two kinds of cells different in the number of power source wires thereof using the connecting cell in FIG. 7.
Figure 10:
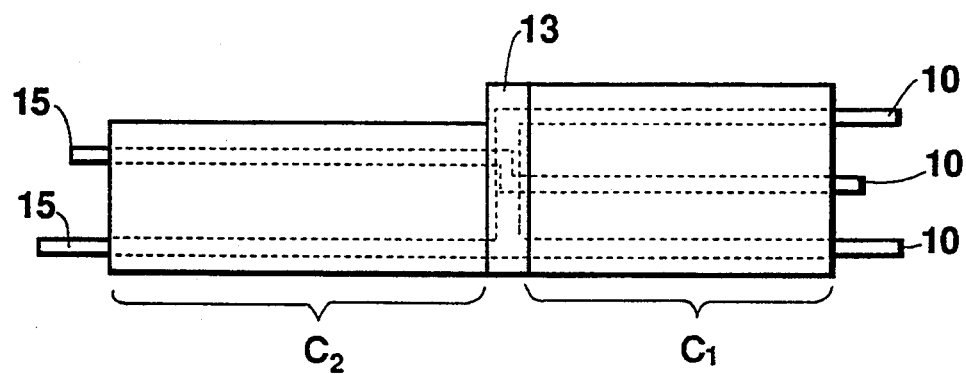
FIG. 10 shows a preferable example of the connection of two kinds of cells different in the number of power source wires thereof using the connecting cell in FIG. 7.

FIGS. 7 and 8 show an embodiment of a connecting cell 13 according to the present invention for connecting two kinds of cells having a different number of power source wires from each other, more specifically, the drawings show the case in which are connected cells having three power source wires and other cells having two power source wires, the wire consisting of aluminium. Further in the drawings, there are shown vias H and a connecting strip 16. When the two kinds of cells are connected at random as shown in FIG. 9, a plurality of the connecting cells 13 is required and the entire lateral length of the connected cells increases by the length corresponding to the number of the connecting cells employed. Additionally, when the cells having two power source wires are interposed between the cells having three power source wires, wiring in the area becomes extremely difficult. As shown in FIG. 10, when the cells having the same number of wires are respectively assembled together, these two kinds of assembled cells can be connected with only one connecting cell 13.

Figure 11:
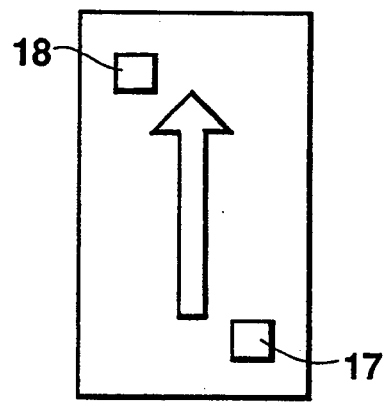
FIG. 11 shows a cell having an input and an output terminal which are disposed away from each other in the vertical direction.
Figure 12:
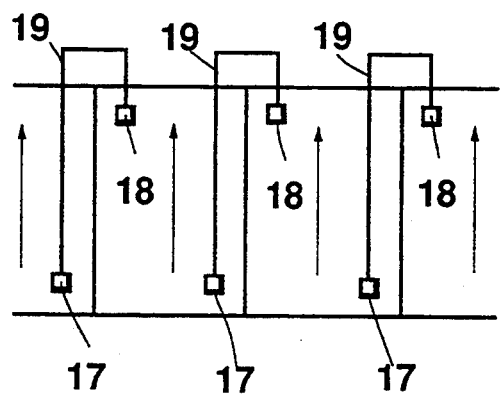
FIG. 12 shows an example of a connection of the cells in FIG. 11 according to the prior art.

Next, there will be described a case in which are connected cells having an input and output terminal disposed away, in the vertical direction of the cell, from each other with reference to FIG. 11. In the drawing, the direction of the cell is designated by an arrow. Since the direction of the conventional cell having two-wire type power source wires can not be changed vertically in one cell row, the cells should be so arranged so that the directions thereof become the same. Accordingly, each wire 19 for connecting each pair of input terminals 17 and output terminals 18 of each adjacent pair of the cells must be relatively long.

Figure 13:
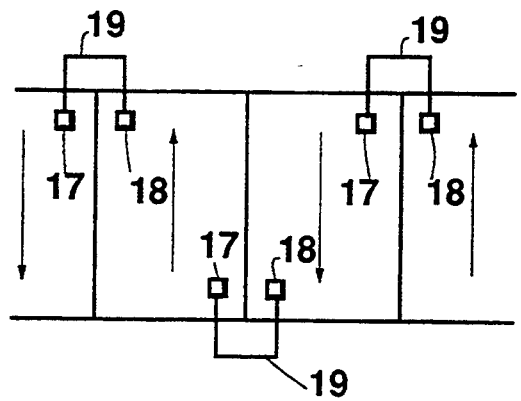
FIG. 13 shows an example of a connection of the cells in FIG. 11 according to the present invention.

According to the present invention, the electrical potentials of respective power source wires can be optionally arranged to be vertically symmetrical. Thus, as shown in FIG. 13, the directions of the cells can be arranged so that each pair of the input terminal 17 and the output terminal 18 to be connected can be adjacent to each other to shorten the wire 19. This method is applicable to other cases in which different kinds of cells are connected.

As seen clearly from the foregoing explanation of an embodiment of the present invention, the area for arranging circuit elements therein can be increased in the vertical direction by an increase in the number of power source wires in a standard cell according to the present invention, thus the elements can be flexibly arranged in the cell, so that the lateral length of the cell is reduced as compared with conventional cells, if the same number of elements are respectively arranged. Since the electrical potentials of respective power source wires can be arranged vertically symmetrical in the cell according to the present invention, the direction of the cell can be changed vertically in one cell row. Accordingly, wires for connecting cells respectively having an input and an output terminal which are vertically disposed away from each other can be shortened. Moreover, an entire area of a circuit pattern formed by automatic placement and routing can also be reduced.

Various modifications will become possible for those skilled in the art after receiving the teachings of the present invention disclosure without departing from the scope thereof.

What is claimed is:

1. A standard cell comprising:
    first and second voltage lines of a first voltage level extending parallel to each other;
    a third voltage line of a second voltage level different from said first voltage level, said third voltage line extending between said first and second voltage lines parallel to said first and second voltage lines; and
    a circuit arrangement formed in areas interposed between said third voltage line and said first voltage line and between said third voltage line and said second voltage line.

2. A cell, comprising:
    at least three power source wires arranged at predetermined intervals, two of said three power source wires providing power at a first voltage level and a third of said three power source wires providing power at a second voltage level which is different from said first voltage level; and
    at least two circuit-element arranging areas respectively interposed between each adjacent pair of said power source wires such that a lateral length of said cell is minimized, said at least two circuit-element arranging areas completely containing circuit elements which form a standard cell.

3. The cell as claimed in claim 2, wherein one of said power source wires is a low potential power source wire and the other power source wires are high potential power source wires.

4. The cell as claimed in claim 2, wherein electric potentials of said at least three power source wires are arranged symmetrically from a central position of said power source wires toward positions away from said central position.

5. An electrical circuit comprising:
    a plurality of standard cells each including at least three power source wires arranged at predetermined intervals and at least two circuit-element arranging areas respectively interposed between each adjacent pair of said power source wires such that a lateral length of said standard cells is minimized, two of said three power source wires providing power at a first voltage level and a third of said three power source wires providing power at a second voltage level which is different from said first voltage level;
    wherein said standard cells are arranged so as to make an input terminal and an output terminal, of adjacent standard cells, next to each other away from a centerline of said standard cells.

6. An arrangement of at least two standard cells, said arrangement comprising:
    a first standard cell having at least three power source wires, two of said three power source wires providing power at a first voltage level and a third of said three power source wires providing power at a second voltage level which is different from said first voltage level;
    a second standard cell having at least two power source wires; and
    a connecting cell for connecting said first and second standard cells to each other.

7. The arrangement as claimed in claim 6, wherein the first standard cells each having at least three power source wires are assembled together to form a cell group, the second standard cells each having at least two power source wires are assembled together to form another cell group, and wherein said two cell groups are connected to each other with one connecting cell.

8. A row of standard cells each provided with a high voltage source line and a low voltage line which are coupled to corresponding lines of adjacent cells to form continuous lines, wherein:
    at least one of said standard cells is provided with a third voltage source line which is electrically connected to one of said high voltage source line and said low voltage source line.

9. A standard cell for use in a large scale integrated circuit which includes a binary logic circuit, said standard cell comprising:
    constituent semiconductor elements; and
    three voltage source lines located in the same level layer and extending parallel to each other through said standard cell and providing binary logic levels for said semiconductor elements, two of said three voltage source lines providing power at a first voltage level and a third voltage source line of said three voltage source lines providing power at a second voltage level which is different from said first voltage level.

10. A row of standard cells operative with first and second voltages, which are different from each other, as a power supply, each cell comprising:
    first and second lines both for the same purpose of supplying said first voltage, said first and second lines being coupled to corresponding lines of adjacent standard cells to form two continuous lines; and
    a third line located between said first and second lines for supplying said second voltage, said third line being coupled to corresponding lines of adjacent standard cells to form a continuous line.

11. A reversible standard cell comprising:
    a logic circuit for executing a desired function;
    a central voltage source line extending through the center of the standard cell for supplying a first voltage; and
    a pair of side voltage source lines, extending through edges of the standard cell in parallel to the central voltage source line and located the same distance from the central voltage source line, for supplying a second voltage different from the first voltage,
    wherein, when combined with other standard cells in order to form a row of standard cells, the central and side voltage source lines are coupled to corresponding lines of adjacent standard cells to form three continuous lines.

12. A large scale integrated circuit comprising:
    a plurality of rows each of which includes a number of standard cells of different types arranged in a line and operative with first and second voltages, adjacent rows of said plurality of rows being separated from each other by a wiring area in which a plurality of electrical connections between standard cells of adjacent rows are made, each standard cell including first and second lines both for the same purpose of supplying said first voltage, said first and second lines being coupled to corresponding lines of adjacent standard cells to form two continuous lines; and a third line located between said first and second lines for supplying said second voltage, said third line being coupled to corresponding lines of adjacent standard cells to form a continuous line, wherein said first and second lines have reflectional symmetry with said third line as an axis of symmetry.

13. A large scale integrated circuit as set forth in claim 12, wherein said standard cells are arranged so as to make an input terminal and an output terminal of adjacent standard cells next to each other away from a centerline of said standard cells.

14. In a large scale integrated circuit comprising a plurality of parallel rows which include a plurality of first standard cells and a plurality of second standard cells arranged in a line and operative with first and second voltages, adjacent rows of said rows being separated from each other by a wiring area in which wirings are formed to make electrical connections between respective standard cells on adjacent rows, said first standard cells including flip-flops and arranged on one of said rows, said second standard cells including circuit elements other than flip-flops and arranged on another of said rows, said first standard cells comprising:

first and second lines both for the same purpose of supplying said first voltage, said first and second lines being coupled to corresponding lines of adjacent first standard cells to form two continuous lines; and a third line located between said first and second lines for supplying said second voltage, said third line being coupled to corresponding lines of adjacent standard cells to form a continuous line, said first and second lines having reflectional symmetry with said third line as an axis of symmetry, each of said second standard cells comprising:

a fourth line located near a first edge of a second standard cell for supplying said first voltage, said fourth line being coupled to corresponding lines of adjacent standard cells to form a continuous line; and a fifth line located near a second edge of said second standard cell opposite said first edge for supplying said second voltage, said fifth line being coupled to corresponding lines of adjacent standard cells to form a continuous line.

* * * * *